United States Patent
Chou et al.

(10) Patent No.: US 10,573,734 B1
(45) Date of Patent: Feb. 25, 2020

(54) HIGH ELECTRON MOBILITY TRANSISTOR AND METHOD FOR FORMING THE SAME

(71) Applicant: Vanguard International Semiconductor Corporation, Hsinchu (TW)

(72) Inventors: Yu-Chieh Chou, New Taipei (TW); Hsin-Chih Lin, Hsinchu (TW); Chang-Xiang Hung, Budai Township (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/235,026

(22) Filed: Dec. 28, 2018

(51) Int. Cl.
  *H01L 29/778* (2006.01)
  *H01L 29/66* (2006.01)
  *H01L 29/43* (2006.01)
(52) U.S. Cl.
  CPC .......... *H01L 29/778* (2013.01); *H01L 29/432* (2013.01); *H01L 29/66462* (2013.01)
(58) Field of Classification Search
  None
  See application file for complete search history.

(56) References Cited

U.S. PATENT DOCUMENTS 10,002,956 B1 * 6/2018 Lin ............... H01L 29/7786
2017/0062581 A1 3/2017 You et al.

\* cited by examiner

*Primary Examiner* — Herve-Louis Y Assouman
(74) *Attorney, Agent, or Firm* — Birch, Stewart, Kolasch & Birch, LLP

(57) ABSTRACT

A HEMT includes a buffer layer disposed on the substrate. A barrier layer is disposed on the buffer layer. A channel layer is disposed in the buffer layer adjacent to an interface of the buffer layer and the barrier layer. A band adjustment layer is disposed on the barrier layer, including a first band adjustment layer, a second band adjustment layer, and a third band adjustment layer from top to bottom. A passivation layer is disposed on the barrier layer adjoining the band adjustment layer. A gate electrode is disposed on the band adjustment layer. Source/drain electrodes are disposed on opposite sides of the gate electrode on the barrier layer through the passivation layer. The first band adjustment layer, the second band adjustment layer, and the third band adjustment layer include N-type doped, undoped, and P-type doped III-V or II-VI semiconductors, respectively.

20 Claims, 7 Drawing Sheets

100

| 102 |

| 104 |
| 102 |

FIG. 2

HIGH ELECTRON MOBILITY TRANSISTOR AND METHOD FOR FORMING THE SAME

BACKGROUND

Technical Field

The disclosure relates to a semiconductor technology, and more particularly to a high electron mobility transistor (HEMT).

Description of the Related Art

High electron mobility transistors (HEMT) are widely applied in high-power semiconductor devices due to their many advantages, which include a high breakdown voltage and a high output voltage. This allows them to meet the market demand for consumer electronic products, including communications hardware, electric vehicles, and home appliances.

Enhancement mode (E-mode) high electron mobility transistors are cut off when a gate voltage is not applied. Traditionally, a P-type III-V semiconductor is used as a band adjustment layer that is electrically connected to the gate electrode. Ultra-high voltage applications demand a higher threshold voltage (Vt) from high electron mobility transistors. However, gate leakage current is also increased and may easily cause device damage.

Although existing high electron mobility transistors have generally been adequate for their intended purposes, they have not been entirely satisfactory in all respects and need to be improved. The threshold voltage of high electron mobility transistors in particular needs to be raised, and their gate leakage current needs to be lowered.

BRIEF SUMMARY

The present disclosure provides a high electron mobility transistor (HEMT). The high electron mobility transistor includes a buffer layer disposed on a substrate. The high electron mobility transistor further includes a barrier layer disposed on the buffer layer. A channel layer is disposed in the buffer layer adjacent to an interface between the buffer layer and the barrier layer. The high electron mobility transistor further includes a band adjustment layer disposed on the barrier layer. The band adjustment layer comprises a first band adjustment layer, a second band adjustment layer, and a third band adjustment layer from top to bottom. The high electron mobility transistor further includes a passivation layer disposed on the barrier layer adjoining the band adjustment layer. The high electron mobility transistor further includes a gate electrode disposed on, and electrically connected to, the band adjustment layer. The high electron mobility transistor further includes source/drain electrodes disposed on opposite sides of the gate electrode respectively on the barrier layer through the passivation layer. The first band adjustment layer comprises N-type doped III-V semiconductors or N-type doped II-VI semiconductors. The second band adjustment layer comprises undoped III-V semiconductors or undoped II-VI semiconductors. The third band adjustment layer comprises P-type doped III-V semiconductors or P-type doped II-VI semiconductors.

The present disclosure also provides a method for forming a high electron mobility transistor. The method for forming a high electron mobility transistor includes forming a buffer layer on a substrate. The method for forming a high electron mobility transistor further includes forming a barrier layer on the buffer layer. A channel layer is disposed in the buffer layer adjacent to an interface between the buffer layer and the barrier layer. The method for forming a high electron mobility transistor further includes forming a band adjustment layer on the barrier layer. The band adjustment layer comprises a first band adjustment layer, a second band adjustment layer, and a third band adjustment layer from top to bottom. The method for forming a high electron mobility transistor further includes forming a passivation layer on the barrier layer adjoining the band adjustment layer. The method for forming a high electron mobility transistor further includes forming a gate electrode on, and electrically connected to, the band adjustment layer. The method for forming a high electron mobility transistor further includes forming source/drain electrodes on opposite sides of the gate electrode respectively on the barrier layer through the passivation layer. The first band adjustment layer comprises N-type doped III-V semiconductors or N-type doped II-VI semiconductors. The second band adjustment layer comprises undoped III-V semiconductors or undoped II-VI semiconductors. The third band adjustment layer comprises P-type doped III-V semiconductors or P-type doped II-VI semiconductors.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1-3, 4A, 4B, 4C, 5-8 are cross-sectional representations of various stages of forming a high electron mobility transistor in accordance with some embodiments

DETAILED DESCRIPTION

Figure 3:
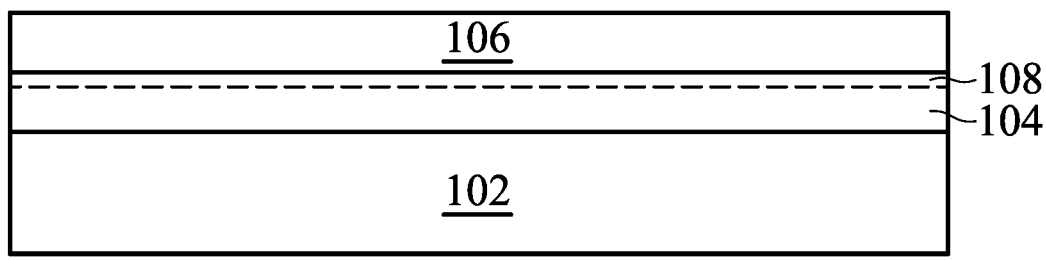

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Although some embodiments are discussed with operations performed in a particular order, these operations may be performed in another logical order. In different embodiments, additional operations can be provided before, during, and/or after the stages described the present disclosure. Some of the stages that are described can be replaced or eliminated for different embodiments. Additional features can be added to the high electron mobility transistor in the present disclosure. Some of the features described below can be replaced or eliminated for different embodiments.

The embodiments of the present disclosure provide a high electron mobility transistor (HEMT). By forming band adjustment layer beneath the gate electrode, which is a band adjustment layer structure of N-type doped, undoped, and P-type doped III-V semiconductors or II-VI semiconductors from top to bottom, the threshold voltage may be raised effectively, and the gate leakage current may be reduced.

Figures 1, 2:
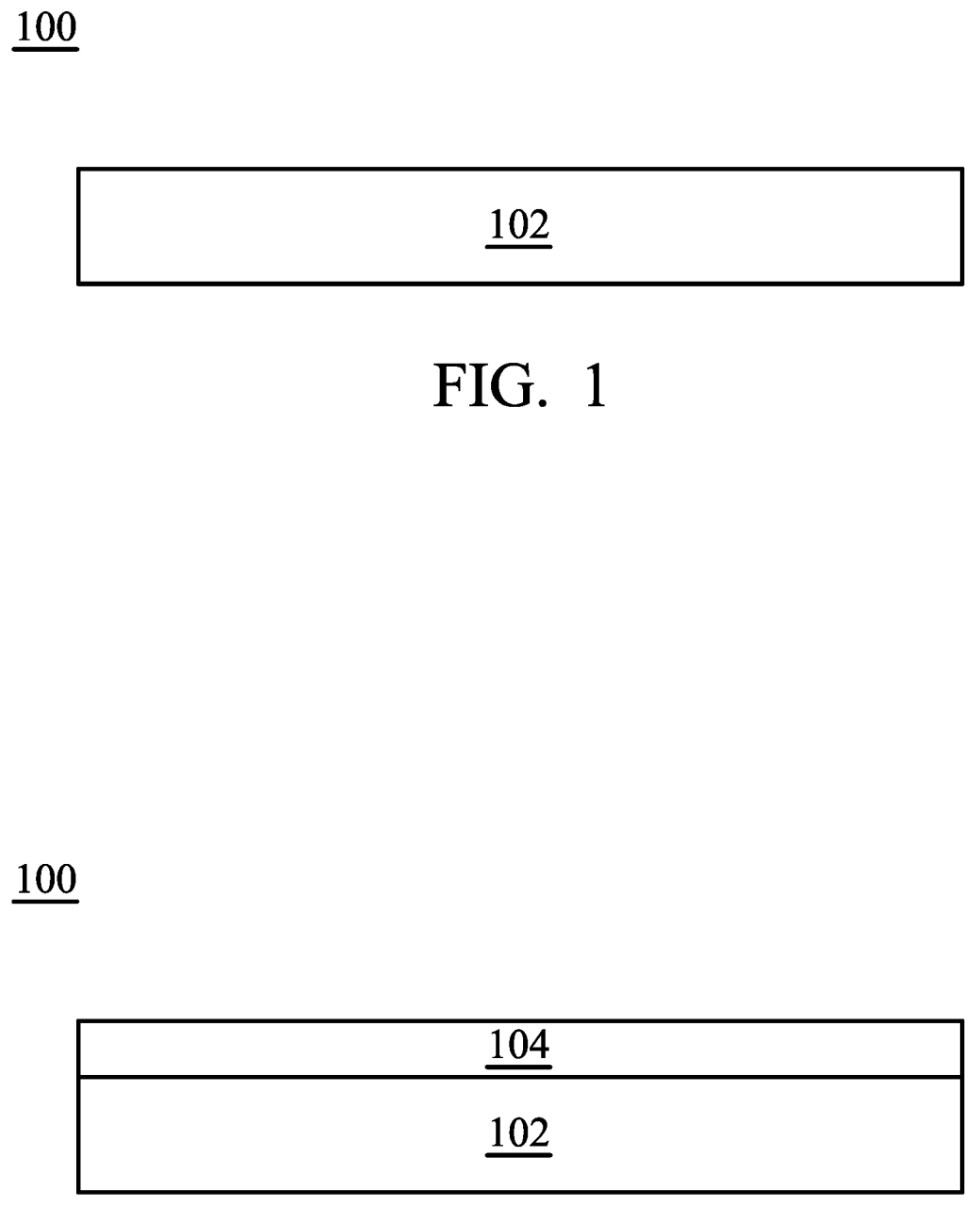

FIGS. 1 to 8 are cross-sectional representations of various stages of forming the high electron mobility transistor 100 in accordance with some embodiments of the present disclosure. As shown in FIG. 1, a substrate 102 is provided. The substrate 102 may be an $Al_2O_3$ (sapphire) substrate. In addition, the substrate may also be elementary semiconductors including Si or Ge; compound semiconductors including GaN, SiC, GaAs, GaP, InP, InAs, and/or InSb; alloy semiconductors including SiGe, GaAsP, AlInAs, AlGaAs, GaInAs, GaInP, and/or GaInAsP, or a combination thereof. In some embodiments, the substrate 102 may be a single crystal substrate, a multi-layer substrate, a gradient substrate, other suitable substrates, or a combination thereof. Moreover, the substrate 102 may also include a semiconductor on insulator (SOI) substrate. The above SOI substrate may include a base plate, a buried oxide (BOX) layer disposed on the base plate, and a semiconductor layer disposed on the buried oxide (BOX) layer.

Next, as shown in FIG. 2, a buffer layer 104 is formed on the substrate 102. In some embodiments, the buffer layer 104 includes a III-V semiconductor such as GaN. The buffer layer may also include AlGaN, AlN, GaAs, GaInP, AlGaAs, InP, InAlAs, InGaAs, other suitable III-V semiconductor materials, or a combination thereof. In some embodiments, the buffer layer 104 has a thickness less than 20 μm. In some embodiments, the buffer layer 104 is formed on the substrate 102 by molecular-beam epitaxy (MBE), metalorganic chemical vapor deposition (MOCVD), hydride vapor phase epitaxy (HVPE), other suitable methods, or a combination thereof.

Next, as shown in FIG. 3, a barrier layer 106 is formed on the buffer layer 104. In some embodiments, the barrier layer 106 includes a material different from that of the buffer layer 104. The barrier layer 106 may include III-V semiconductors such as $Al_xGa_{1-x}N$, where 0<x<1. The barrier layer 106 may also include GaN, AlN, GaAs, GaInP, AlGaAs, InP, InAlAs, InGaAs, other suitable III-V materials, or a combination thereof. In some embodiments, the barrier layer 106 has a thickness less than 100 nm. In some embodiments, the barrier layer 106 is formed on the buffer layer 104 by molecular-beam epitaxy (MBE), metalorganic chemical vapor deposition (MOCVD), hydride vapor phase epitaxy (HVPE), other suitable methods, or a combination thereof.

Since the buffer layer 104 and the barrier layer 106 are formed of different materials, the band gaps of them are different. A heterojunction is formed at the interface between the buffer layer 104 and the barrier layer 106. The band bends at the heterojunction, and a quantum well is formed at the deep of the conduction band. The electrons produced by piezoelectricity are confined in the quantum well. Therefore, a two-dimensional electron gas (2DEG) is formed at the interface between the buffer layer 104 and the barrier layer 106, and a conducting current is formed. As shown in FIG. 3, a channel region 108 is formed at the interface between the buffer layer 104 and the barrier layer 106. The channel region 108 is where the conducting current is formed by the two-dimensional electron gas (2DEG).

Figure 4A:
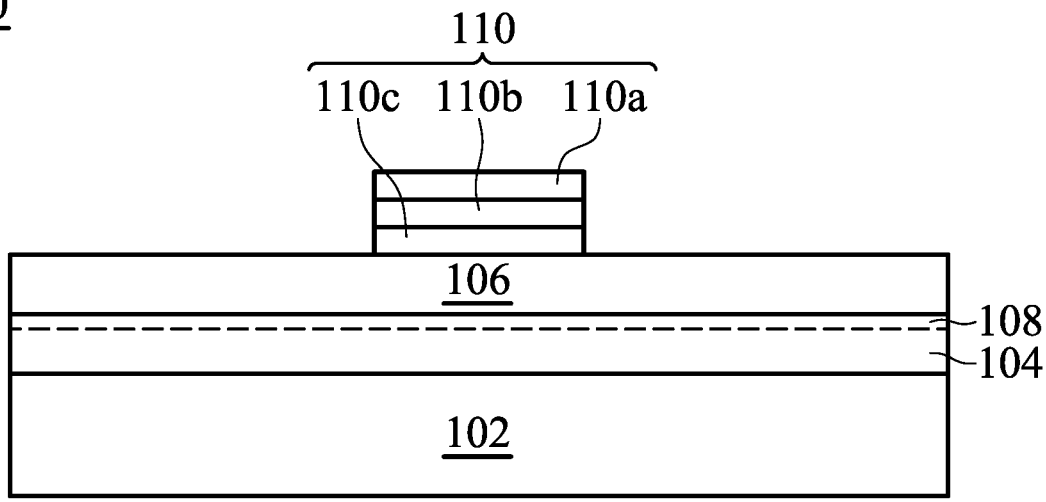

Next, as shown in FIG. 4A, a band adjustment layer 110 is formed on the barrier layer 106. In some embodiments, the band adjustment layer 110 includes a first band adjustment layer 110a, a second band adjustment layer 110b, and a third band adjustment layer 110c. In some embodiments, the first band adjustment layer 110a is in direct contact with the second band adjustment layer 110b, and the second band adjustment layer 110b is in direct contact with the third band adjustment layer 110c.

In some embodiments, the third band adjustment layer 110c includes P-type doped III-V semiconductors or P-type doped II-VI semiconductors. For example, the third band adjustment layer 110c includes P-type doped GaN, AlGaN, AlN, GaAs, AlGaAs, InP, InAlAs, InGaAs, CdS, CdTe, SiGe, SiC, or ZnS. In some embodiments, the third band adjustment layer 110c is P-type doped by Mg, Zn, Ca, Be, Sr, Ba, Ra, C, Ag, Au, Li, or Na. The P-type doping concentration is between $1E15/cm^3$ and $1E25/cm^3$. In some embodiments, the thickness of the third band adjustment layer 110c is between 1% and 99% of the thickness of the band adjustment layer 110, preferably between 50% and 90% of the thickness of the band adjustment layer 110. The third band adjustment layer 110c has a thickness of between 1 nm and 1000 nm. In some embodiments, the energy level of the energy band may be adjusted by modifying the P-type dopant concentration and the thickness of the third band adjustment layer 110c. For example, the energy band may be at a higher level when the third band adjustment layer 110c has a higher P-type dopant concentration and when the third band adjustment layer 110c has a thicker thickness. Therefore, there may be less two-dimensional electron gas (2DEG) produced in the channel region 108. On the other hand, the energy band may be at a lower level when the third band adjustment layer 110c has a lower P-type dopant concentration and when the third band adjustment layer has a thinner thickness. Therefore, there may be more two-dimensional electron gas (2DEG) produced in the channel region 108. In some embodiments, the third band adjustment layer 110c may be formed by depositing P-type doped III-V semiconductor materials or P-type doped II-VI semiconductor materials on the barrier layer 106 by molecular-beam epitaxy (MBE), metalorganic chemical vapor deposition (MOCVD), chemical vapor deposition (CVD), or hydride vapor phase epitaxy (HVPE).

In some embodiments, the second band adjustment layer 110b includes undoped III-V semiconductors or undoped II-VI semiconductors. For example, the second band adjustment layer 110b includes undoped GaN, AlGaN, AlN, GaAs, AlGaAs, InP, InAlAs, InGaAs, CdS, CdTe, SiGe, SiC, or ZnS. In some embodiments, the thickness of the second band adjustment layer 110b is between 1% and 99% of the thickness of the band adjustment layer 110, preferably between 10% and 50% of the thickness of the band adjustment layer 110. In some embodiments, the second band adjustment layer 110b has a thickness of between 10 nm and 1000 nm. If the second band adjustment layer 110b is too thick, the gate resistance may be too high. If the second band adjustment layer 110b is too thin, the depletion region may be too small when reverse bias voltage is applied on the band adjustment layer 110, and the gate leakage current may not be reduced effectively. In some embodiments, the second band adjustment layer 110b may be formed by depositing undoped III-V semiconductor materials or undoped II-VI semiconductor materials on the third band adjustment layer 110c by molecular-beam epitaxy (MBE), metalorganic chemical vapor deposition (MOCVD), chemical vapor deposition (CVD), or hydride vapor phase epitaxy (HVPE).

In some embodiments, the first band adjustment layer 110a includes N-type doped III-V semiconductors or N-type doped II-VI semiconductors. For example, the first band adjustment layer 110a includes N-type doped GaN, AlGaN, AlN, GaAs, AlGaAs, InP, InAlAs, InGaAs, CdS, CdTe, SiC, SiGe, or ZnS. In some embodiments, the first band adjustment layer 110a is N-type doped by Si, C, Ge, Sn, Pb, Cl, Br, or I. The N-type doping concentration is between about $1E15/cm^3$ and $1E25/cm^3$. In some embodiments, the thickness of the first band adjustment layer 110a is between 1% and 99% of the thickness of the band adjustment layer 110, preferably between 10% and 50% of the thickness of the band adjustment layer 110. The first band adjustment layer 110a has a thickness of between 1 nm and 1000 nm. In some embodiments, the energy level of the energy band may be adjusted by modifying the N-type dopant concentration and the thickness of the first band adjustment layer 110a. For example, when the first band adjustment layer 110a has a higher N-type dopant concentration and a thicker thickness, the overall energy band of the band adjustment layer 110 may not be easily lowered while the high electron mobility transistor 100 is turned on (the gate voltage is greater than zero). On the other hand, when the first band adjustment layer 110a has a lower N-type dopant concentration and a thinner thickness, the overall energy band of the band adjustment layer 110 may be easily lowered while the high electron mobility transistor 100 is turned on (the gate voltage is greater than zero). In some embodiments, the first band adjustment layer 110a may be formed by depositing N-type doped III-V semiconductor materials or N-type doped II-VI semiconductor materials on the second band adjustment layer 110b by molecular-beam epitaxy (MBE), metalorganic chemical vapor deposition (MOCVD), chemical vapor deposition (CVD), or hydride vapor phase epitaxy (HVPE).

In some embodiments, the first band adjustment layer 110a, the second band adjustment layer 110b, and the third band adjustment layer 110c may include the same III-V semiconductor materials or II-VI semiconductor materials. The band structure of the band adjustment layer 110 may be modified by adjusting the N-type dopant concentration, the un-doped thickness, and the P-type dopant concentration. In some other embodiments, the first band adjustment layer 110a, the second band adjustment layer 110b, and the third band adjustment layer 110c may include different III-V semiconductor materials or II-VI semiconductor materials. The band structure of the band adjustment layer 110 may be modified using different band structures of different materials, and by adjusting the N-type dopant concentration, the un-doped thickness, and the P-type dopant concentration.

Next, the first band adjustment layer 110a, the second band adjustment layer 110b, and the third band adjustment layer 110c are patterned by a lithography process and an etching process to form a band adjustment layer 110. The photolithography process may include photoresist coating (e.g., spin-on coating), soft baking, mask aligning, pattern exposure, post-exposure baking, photoresist development, and rinsing and drying (e.g., hard baking), other applicable techniques, or a combination thereof. The etching process may include a dry etching process (e.g., reactive ion etching (RIE), an anisotropic plasma etching method), a wet etching process, or a combination thereof. In some embodiments, the band adjustment layer 110 is beneath the gate electrode that will be formed later.

It should be noted that, in the above description, the third band adjustment layer 110c, the second band adjustment layer 110b, and the first band adjustment layer 110a are respectively deposited and then patterned together to form the band adjustment layer 110. However, the present disclosure is not limited thereto. In some embodiments, the third band adjustment layer 110c, the second band adjustment layer 110b, and the first band adjustment layer 110a are respectively deposited and then patterned respectively to form the band adjustment layer 110.

Figure 4B:
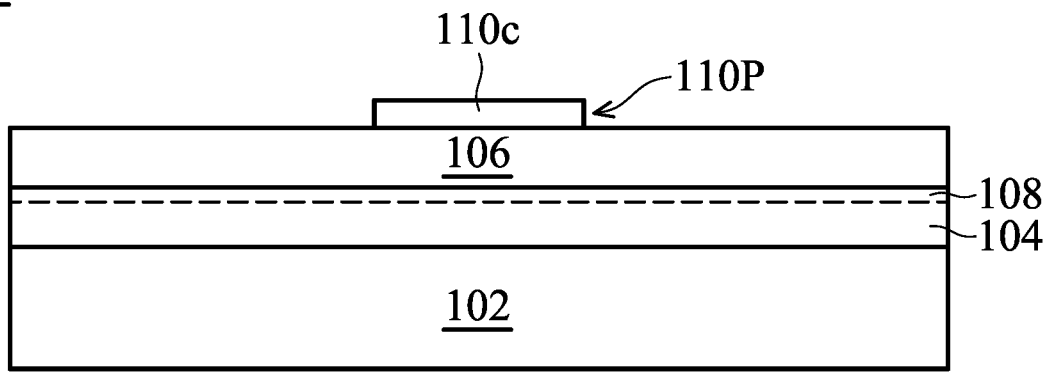
Figure 4C:
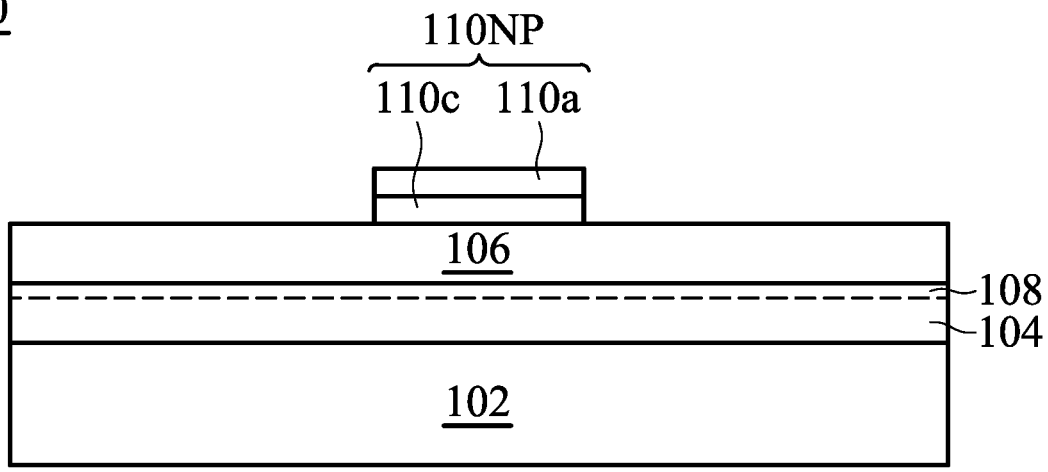

Compared to the P band adjustment layer structure 110P which only includes the third band adjustment structure 110c as shown in FIG. 4B or the NP band adjustment layer structure 110NP which only includes the first band adjustment layer 110a and the third band adjustment layer 110c from top to bottom as shown in FIG. 4C, by forming an NIP band adjustment layer 110 which includes the first band adjustment layer 110a, the second band adjustment layer 110b, and the third band adjustment layer 110c from top to bottom, the energy band may be raised when the high electron mobility transistor 100 is turned on (the gate voltage is greater than zero). In this way, the energy of the conduction band at the interface between the buffer layer 104 and the barrier layer 106 is higher, which results in less two-dimensional electron gas (2DEG) in the channel region 108. If it is desired to form the conducting current in the channel region 108, the gate voltage may need to be increased further to lower the energy band and form the conducting current. Therefore, the NIP band adjustment layer structure 110 may raise the threshold voltage of the high electron mobility transistor 100 and eliminate the interference of ultra-high voltage noise. In some embodiments, the high electron mobility transistor 100 with NIP band adjustment layer 110 may be applicable in applications with more than 1000V.

In addition, compared to the P band adjustment layer structure 110P or the NP band adjustment layer structure 110NP, the NIP band adjustment layer structure 110 is under reverse bias voltage when the high electron mobility transistor 100 is turned on (the gate voltage is greater than zero), and the depletion region is enlarged by the second band adjustment layer 110b. In this way, the gate leakage current may be lowered significantly, and therefore the gate voltage operating range may be broadened.

It should be noted that, the band adjustment layer 110 includes three band adjustment layers 110a, 110b, and 110c in FIG. 4A. However, the present disclosure is not limited thereto. The band adjustment layer 110 may include band adjustment layers with more than three layers, which overall includes N-type doped III-V semiconductors or N-type doped II-VI semiconductors, undoped III-V semiconductors or undoped II-VI semiconductors, and P-type doped III-V semiconductors or P-type doped II-VI semiconductors from top to bottom, depending on the demands of the process.

Figure 5:
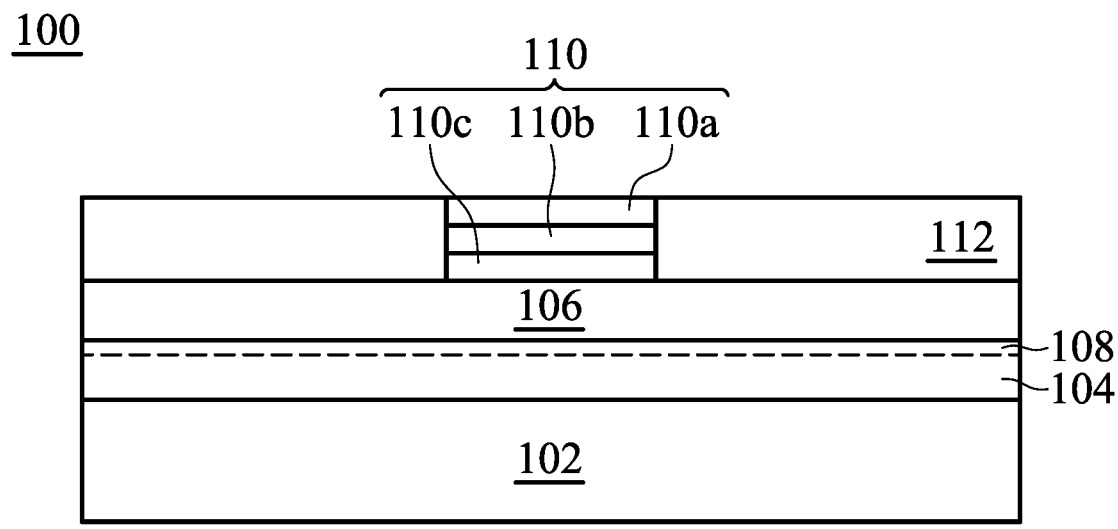

Next, as shown in FIG. 5, a first passivation layer 112 is formed on the barrier layer 106 adjoining the band adjustment layer 110. In some embodiments, the first passivation layer 112 may include $SiO_2$, $SiN_3$, SiON, $Al_2O_3$, AN, polyimide (PI), benzocyclobutene (BCB), polybenzoxazole (PBO), other insulating materials, or a combination thereof. The first passivation layer 112 has a thickness of between 1 nm and 1000 nm. In some embodiments, the first passivation layer 112 may be formed by metalorganic chemical vapor deposition (MOCVD), chemical vapor deposition (CVD), spin-on coating, other applicable method, or a combination thereof. In some embodiments, the first passivation layer 112 may be blanketly formed on the barrier layer 106 and the band adjustment layer 110. Next, the first passivation layer 112 may have a flat upper surface by chemical mechanical polishing (CMP). In some embodiments, the top surface of the first passivation layer 112 is level with the top surface of the band adjustment layer 110. The first passivation layer 112 may protect the films underneath and provide physical isolation and structural support.

Figure 6:
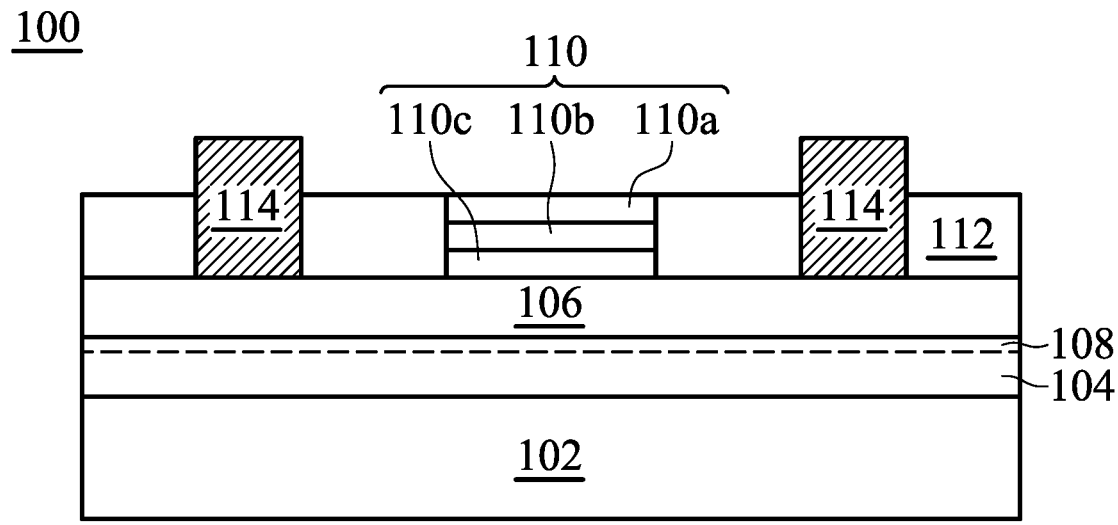

Next, as shown in FIG. 6, source/drain electrodes 114 are formed through the first passivation layer 112 on the barrier layer 106. In some embodiments, the source/drain electrodes 114 may respectively include Ti, Al, W, Au, Pd, other applicable metals, their alloys, or a combination thereof. In some embodiments, source/drain electrode openings are formed in the first passivation layer 112 by a photolithography process and an etching process, and the conductive material is deposited on the first passivation layer 112 and filled in the source/drain electrode openings by chemical vapor deposition (CVD), physical vapor deposition (PVD) (such as evaporation or sputtering), electroplating, atomic layer deposition (ALD), other suitable methods, or a combination thereof. The excess conductive material is then removed by an etching process to form source/drain electrodes 114.

Figure 7:
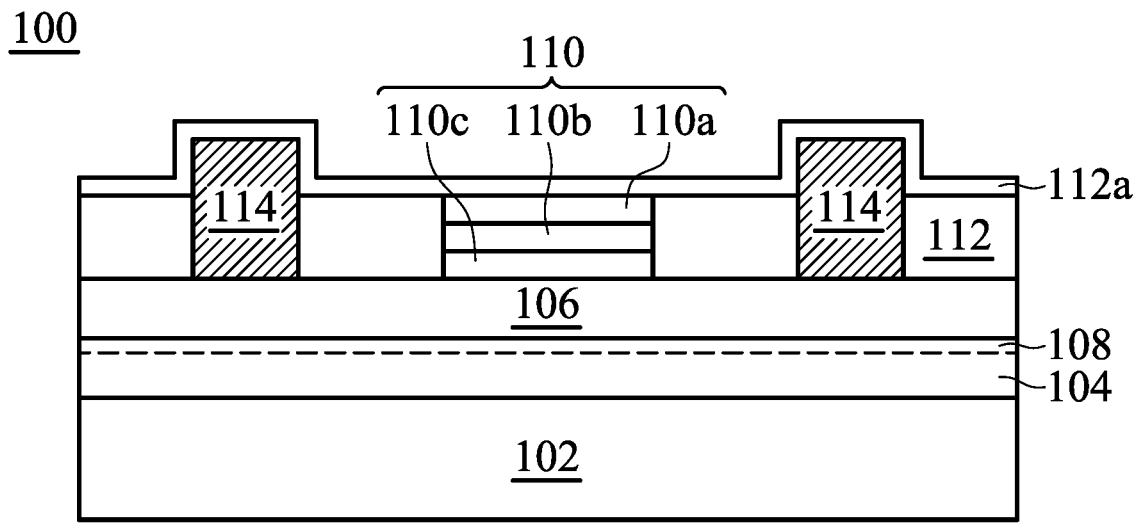

Next, as shown in FIG. 7, a second passivation layer 112a is formed on the first passivation layer 112, the band adjustment layer 110, and the source/drain electrodes 114. In some embodiments, the second passivation layer 112a may include $SiO_2$, $SiN_3$, SiON, $Al_2O_3$, AN, polyimide (PI), benzocyclobutene (BCB), polybenzoxazole (PBO), other insulating materials, or a combination thereof. In some embodiments, the materials of the first passivation layer 112 and the second passivation 112a are the same. In some other embodiments, the materials of the first passivation layer 112 and the second passivation 112a are different. The second passivation layer 112a has a thickness of between 1 nm and 1000 nm. In some embodiments, the second passivation layer 112a is formed by metalorganic chemical vapor deposition (MOCVD), chemical vapor deposition (CVD), spin-on coating, other applicable method, or a combination thereof. In some embodiments, the second passivation layer 112a is conformally formed on the first passivation layer 112, the band adjustment layer 110, and the source/drain electrodes 114.

Figure 8:
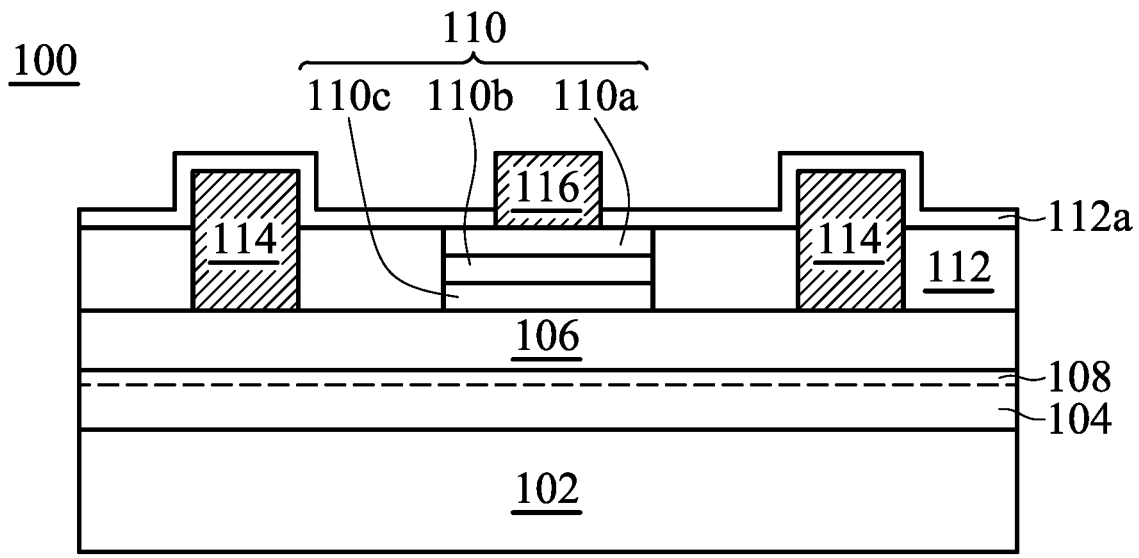

Next, as shown in FIG. 8, a gate electrode 116 is formed on the band adjustment layer 110. In some embodiments, the gate electrode 116 may include polycrystalline-silicon (poly-Si), metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other applicable conductive materials, or a combination thereof. In some embodiments, a gate electrode opening is formed in the second passivation layer 112a by a lithography process and an etching process, and the conductive material is deposited on the second passivation layer 112a and filled in the gate electrode opening by a chemical vapor deposition (CVD) process (such as a low pressure chemical vapor deposition process or a plasma enhanced chemical vapor deposition process), a physical vapor deposition (PVD) process (such as resistive heating evaporation, e-beam evaporation, or sputtering), electroplating, atomic layer deposition (ALD), other suitable process, or a combination thereof. The excess conductive material is then removed by an etching process to form the gate electrodes 116. In some embodiments, the gate electrode 116 and the band adjustment layer 110 are electrically connected.

As mentioned above, by forming an NIP band adjustment layer including N-type doped III-V semiconductors or N-type doped II-VI semiconductors, undoped III-V semiconductors or undoped II-VI semiconductors, and P-type doped III-V semiconductors or P-type doped II-VI semiconductors from top to bottom beneath the gate electrode, the threshold voltage of high electron mobility transistor may be raised, and the interference of ultra-high voltage noises may be eliminated. Moreover, the gate leakage current may be lowered and the gate voltage operating range may be broadened.

Figure 9:
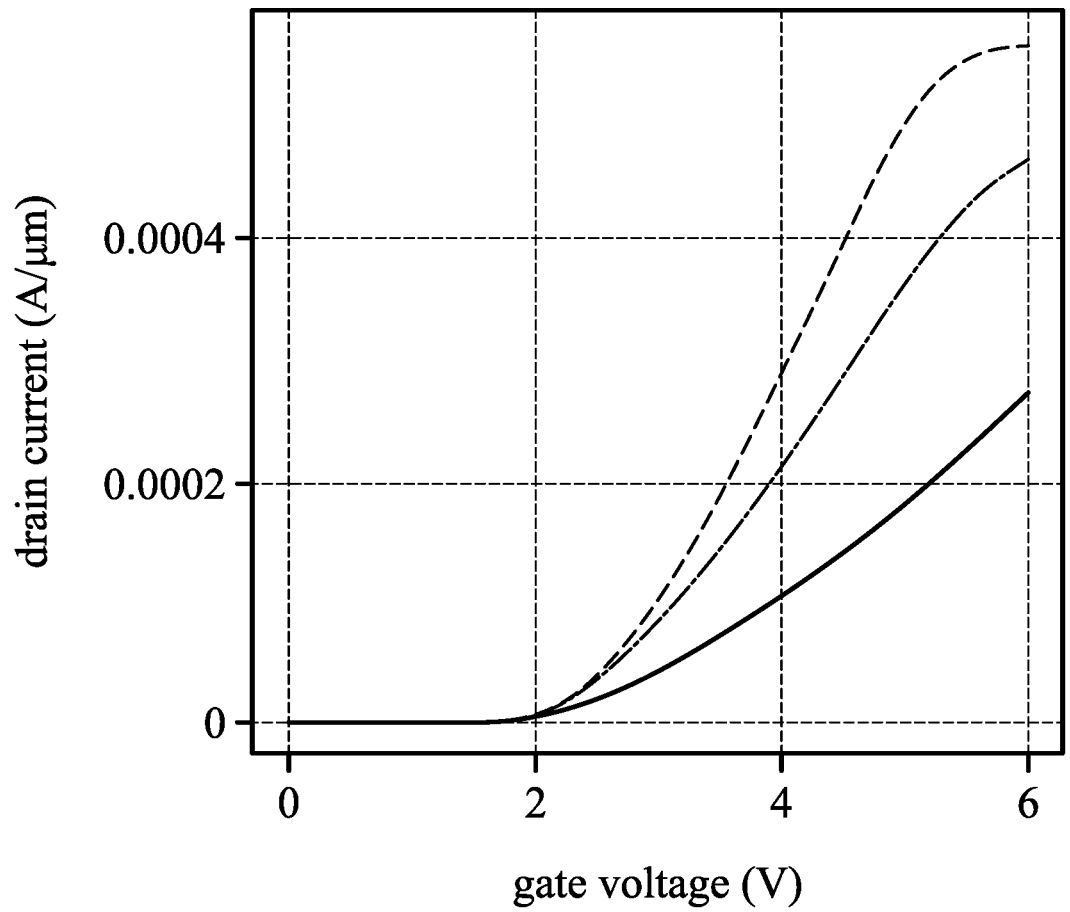
FIG. 9 is a drain current (Id)—gate voltage (Vg) plot of a high electron mobility transistor in accordance with some embodiments.

FIG. 9 is a drain current (Id)—gate voltage (Vg) plot of a high electron mobility transistor in accordance with some embodiments. The dashed line data represents a high electron mobility transistor with a P band adjustment layer structure 110P. The chain line data represents a high electron mobility transistor with a NP band adjustment layer structure 110NP. The solid line data represents a high electron mobility transistor with a NIP band adjustment layer structure 110.

As shown in FIG. 9, under the same drain current, the gate voltage of the high electron mobility transistor with a NIP band adjustment layer structure 110 is greater. That is, the high electron mobility transistor with a NIP band adjustment layer structure 110 has a greater threshold voltage. Therefore, the NIP band adjustment layer structure 110 may effectively increase the threshold voltage when the high electron mobility transistor is turned on (the gate voltage is greater than zero).

Figure 10:
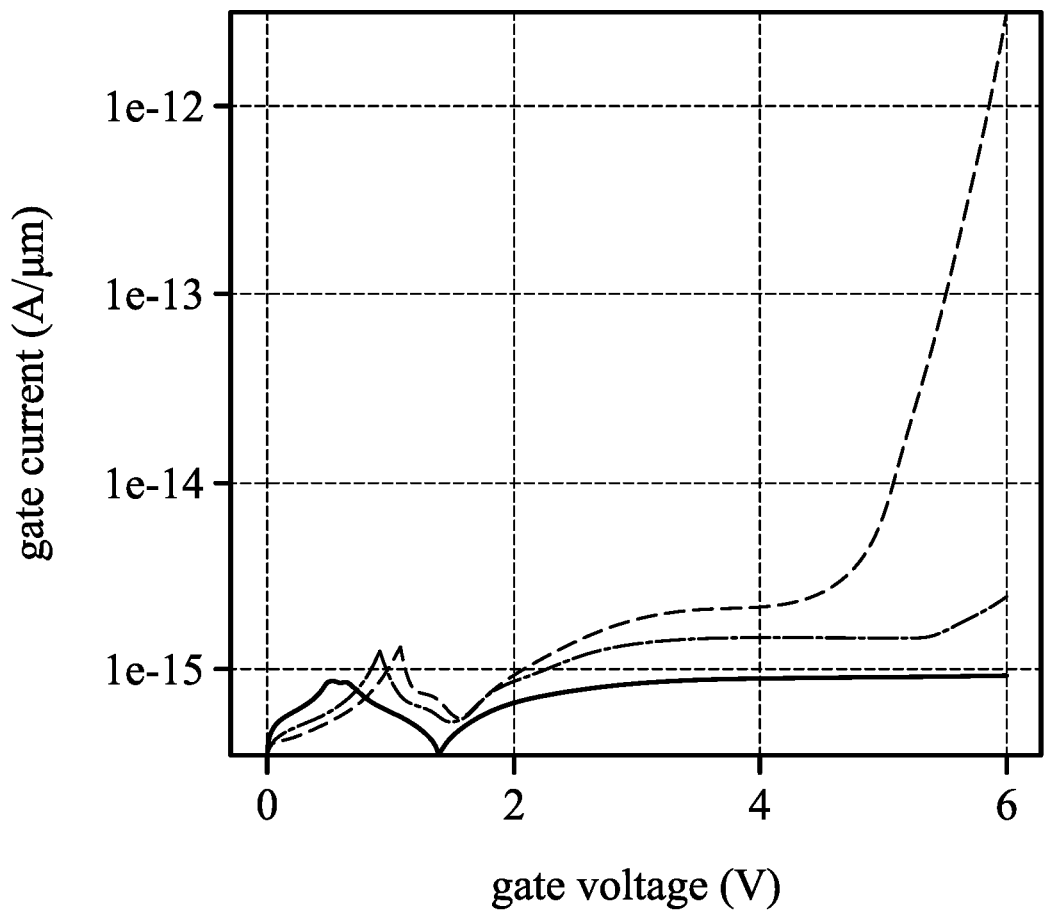
FIG. 10 is a gate current (Ig)—gate voltage (Vg) plot of a high electron mobility transistor in accordance with some embodiments.

FIG. 10 is a gate current (Ig)—gate voltage (Vg) plot of a high electron mobility transistor in accordance with some embodiments. The dashed line data represents a high electron mobility transistor with a P band adjustment layer structure 110P. The chain line data represents a high electron mobility transistor with a NP band adjustment layer structure 110NP. The solid line data represents a high electron mobility transistor with a NIP band adjustment layer structure 110.

As shown in FIG. 10, under the same gate voltage, the gate current of the high electron mobility transistor with a NIP band adjustment layer structure 110 is lower. That is, the gate leakage current of the high electron mobility transistor with a NIP band adjustment layer structure 110 is lower. Therefore, the NIP band adjustment layer structure 110 may effectively increase the gate voltage operating range.

As mentioned above, the present disclosure provides a method for forming a high electron mobility transistor by forming a band adjustment layer (an NIP band adjustment layer) including N-type doped III-V semiconductors or N-type doped II-VI semiconductors, undoped III-V semiconductors or undoped II-VI semiconductors, and P-type doped III-V semiconductors or P-type doped II-VI semiconductors from top to bottom beneath the gate electrode. The threshold voltage of high electron mobility transistor may be raised, and the interference of ultra-high voltage noises may be eliminated. Moreover, the gate leakage current may be lowered and the gate voltage operating range may be broadened.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A high electron mobility transistor (HEMT), comprising:
   a buffer layer disposed on a substrate;
   a barrier layer disposed on the buffer layer, wherein a channel layer is disposed in the buffer layer adjacent to an interface between the buffer layer and the barrier layer;
   a band adjustment layer disposed on the barrier layer, wherein the band adjustment layer comprises a first band adjustment layer, a second band adjustment layer, and a third band adjustment layer from top to bottom;
   a passivation layer disposed on the barrier layer adjoining the band adjustment layer;
   a gate electrode disposed on the band adjustment layer and electrically connected to the band adjustment layer; and
   source/drain electrodes respectively disposed on opposite sides of the gate electrode and disposed on the barrier layer through the passivation layer,
   wherein the first band adjustment layer comprises N-type doped III-V semiconductors or N-type doped II-VI semiconductors, the second band adjustment layer comprises undoped III-V semiconductors or undoped II-VI semiconductors, the third band adjustment layer comprises P-type doped III-V semiconductors or P-type doped II-VI semiconductors.

2. The high electron mobility transistor as claimed in claim 1, wherein the first band adjustment layer is in direct contact with the second band adjustment layer, and the second band adjustment layer is in direct contact with the third band adjustment layer.

3. The high electron mobility transistor as claimed in claim 1, wherein the second band adjustment layer comprises undoped GaN, AlGaN, AlN, GaAs, AlGaAs, InP, InAlAs, InGaAs, CdS, CdTe, SiGe, SiC, or ZnS.

4. The high electron mobility transistor as claimed in claim 1, wherein the second band adjustment layer has a thickness of between 1 nm and 1000 nm.

5. The high electron mobility transistor as claimed in claim 1, wherein a thickness of the second band adjustment layer is between 1% and 99% of a thickness of the band adjustment layer.

6. The high electron mobility transistor as claimed in claim 1, wherein the first band adjustment layer comprises N-type doped GaN, AlGaN, AlN, GaAs, AlGaAs, InP, InAlAs, InGaAs, CdS, CdTe, SiC, SiGe, or ZnS.

7. The high electron mobility transistor as claimed in claim 1, wherein the first band adjustment layer is doped by Si, C, Ge, Sn, Pb, Cl, Br, or I.

8. The high electron mobility transistor as claimed in claim 1, wherein the first band adjustment layer has an N-type doped concentration of between $1E15/cm^3$ and $1E25/cm^3$.

9. The high electron mobility transistor as claimed in claim 1, wherein a thickness of the first band adjustment layer is between 1% and 99% of a thickness of the band adjustment layer.

10. The high electron mobility transistor as claimed in claim 1, wherein the third band adjustment layer comprises P-type doped GaN, AlGaN, AlN, GaAs, AlGaAs, InP, InAlAs, InGaAs, CdS, CdTe, SiC, SiGe, or ZnS.

11. The high electron mobility transistor as claimed in claim 1, wherein the third band adjustment layer is doped by Mg, Zn, Ca, Be, Sr, Ba, Ra, C, Ag, Au, Li, or Na.

12. The high electron mobility transistor as claimed in claim 1, wherein the third band adjustment layer has a P-type doped concentration of between $1E15/cm^3$ and $1E25/cm^3$.

13. The high electron mobility transistor as claimed in claim 1, wherein a thickness of the third band adjustment layer is between 1% and 99% of a thickness of the band adjustment layer.

14. The high electron mobility transistor as claimed in claim 1, wherein the barrier layer comprises $Al_xGa_{1-x}N$, wherein $0<x<1$.

15. The high electron mobility transistor as claimed in claim 1, wherein the buffer layer comprises GaN.

16. The high electron mobility transistor as claimed in claim 1, wherein the passivation layer comprises $SiO_2$, $SiN_3$, SiON, $Al_2O_3$, AlN, polyimide (PI), benzocyclobutene (BCB), or polybenzoxazole (PBO).

17. A method for forming a high electron mobility transistor, comprising:
   forming a buffer layer on a substrate;
   forming a barrier layer on the buffer layer, wherein a channel layer is disposed in the buffer layer adjacent to an interface between the buffer layer and the barrier layer;
   forming a band adjustment layer on the barrier layer, wherein the band adjustment layer comprises a first band adjustment layer, a second band adjustment layer, and a third band adjustment layer from top to bottom;
   forming a passivation layer on the barrier layer adjoining the band adjustment layer;
   forming a gate electrode on the band adjustment layer and electrically connected to the band adjustment layer; and
   forming source/drain electrodes respectively on opposite sides of the gate electrode and on the barrier layer through the passivation layer,
   wherein the first band adjustment layer comprises N-type doped III-V semiconductors or N-type doped II-VI semiconductors, the second band adjustment layer comprises undoped III-V semiconductors or undoped II-VI semiconductors, the third band adjustment layer comprises P-type doped III-V semiconductors or P-type doped II-VI semiconductors.

18. The method for forming a high electron mobility transistor as claimed in claim 17, wherein the second band adjustment layer comprises undoped GaN, AlGaN, AlN, GaAs, AlGaAs, InP, InAlAs, InGaAs, CdS, CdTe, SiGe, SiC, or ZnS.

19. The method for forming a high electron mobility transistor as claimed in claim 17, wherein the second band adjustment layer has a thickness of between 1 nm and 1000 nm.

20. The method for forming a high electron mobility transistor as claimed in claim 17, wherein a thickness of the second band adjustment layer is between 1% and 99% of a thickness of the band adjustment layer.

* * * * *